United States Patent
Kagami et al.

(10) Patent No.: US 7,768,747 B2
(45) Date of Patent: Aug. 3, 2010

(54) THIN-FILM MAGNETIC HEAD AND MANUFACTURING METHOD THEREOF

(75) Inventors: Takeo Kagami, Tokyo (JP); Takayasu Kanaya, Tokyo (JP)

(73) Assignee: TDK Corporation, Tokyo (JP)

( * ) Notice: Subject to any disclaimer, the term of this patent is extended or adjusted under 35 U.S.C. 154(b) by 611 days.

(21) Appl. No.: 11/735,730

(22) Filed: Apr. 16, 2007

(65) Prior Publication Data
US 2008/0253036 A1 Oct. 16, 2008

(51) Int. Cl.
G11B 5/33 (2006.01)
G11B 5/127 (2006.01)
H04R 31/00 (2006.01)

(52) U.S. Cl. .................. 360/319; 29/603.15
(58) Field of Classification Search .......... 360/319; 29/603.14, 603.15
See application file for complete search history.

(56) References Cited

U.S. PATENT DOCUMENTS

| | | | | |
|---|---|---|---|---|
| 5,621,592 | A * | 4/1997 | Gill et al. ................ | 360/319 |
| 2002/0167765 | A1 * | 11/2002 | Sato ........................ | 360/320 |
| 2004/0100737 | A1 * | 5/2004 | Nakamoto et al. ...... | 360/319 |
| 2005/0264948 | A1 * | 12/2005 | Nakamoto et al. ...... | 360/319 |
| 2006/0056117 | A1 * | 3/2006 | Miyauchi et al. ....... | 360/324.12 |
| 2006/0274457 | A1 * | 12/2006 | Watanabe et al. ....... | 360/319 |

FOREIGN PATENT DOCUMENTS

| | | |
|---|---|---|
| JP | 2001-283412 A | 10/2001 |
| JP | 2002-109707 A | 4/2002 |
| JP | 2002-324304 A | 11/2002 |
| JP | 2005-310264 A | 11/2005 |
| JP | 2006-237377 A | 9/2006 |

OTHER PUBLICATIONS

Takeo Kagami et al.; Title: Thin-Film Magnetic Head And Manufacturing Method Thereof; Date filed: Aug. 9, 2007; U.S. Appl. No. 11/836,529; Not Yet Published, filing receipt and application data sheet enclosed.

* cited by examiner

*Primary Examiner*—Brian E Miller
*Assistant Examiner*—Adam B Dravinikas
(74) *Attorney, Agent, or Firm*—Frommer Lawrence & Haug, LLP (57) ABSTRACT

A thin-film magnetic head includes a lower magnetic shield layer, an MR multi-layered structure formed on the lower magnetic shield layer so that current flows in a direction perpendicular to surfaces of laminated layers, and an upper magnetic shield layer formed on the MR multi-layered structure. The lower magnetic shield layer consists of a first soft magnetic layer and a second soft magnetic layer laminated on and magnetically connected with the first soft magnetic layer. A part of an upper surface of the first soft magnetic layer outside both side ends in a track-width direction of the MR multi-layered structure is located lower in height than an upper surface within a region where the MR multi-layered structure is formed, of the lower magnetic shield layer. The second soft magnetic layer is formed outside both side ends in a track-width direction of the MR multi-layered structure.

7 Claims, 8 Drawing Sheets

THIN-FILM MAGNETIC HEAD AND MANUFACTURING METHOD THEREOF

BACKGROUND OF THE INVENTION

1. Field of the Invention

The present invention relates to a thin-film magnetic head with a magnetoresistive effect (MR) element for detecting magnetic intensity in a magnetic recording medium and for outputting a read signal, and to a manufacturing method of the thin-film magnetic head.

2. Description of the Related Art

Recently, in order to satisfy the demand for higher recording density and downsizing in a hard disk drive (HDD) apparatus, higher sensitivity and resolution of a thin-film magnetic head are required. Thus, as for a thin-film magnetic head with a recording density performance of 100 Gbspi or more, a tunnel magnetoresistive effect (TMR) head with a TMR read head element having a current perpendicular to plane (CPP) structure capable of achieving higher sensitivity and resolution is coming into practical use instead of a general giant magnetoresistive effect (GMR) head with a GMR read head element having a current in plane (CIP) structure.

The head structure in which a sense current flows in a direction parallel with surfaces of laminated layers is called as the CIP structure, whereas the other head structure in which the sense current flows in a direction perpendicular to surfaces of laminated layers is called as the CPP structure. In recent years, GMR heads with the CPP structure are being developed.

Because the CPP structure utilizes magnetic shield layers themselves as electrodes, short-circuit or insufficient insulation between magnetic shield layers and element layer, which had been serious problem for narrowing the read gap in the CIP structure never inherently occurs. Therefore, the CPP structure lends itself to a high recording density head.

In the thin-film magnetic head with the CPP structure capable of narrowing the read gap, when it is required to further narrow the read gap in order to scale up high resolution in the track-width direction, the following points are important:

(1) Narrowing a width of a magnetization-free layer or a free layer in a track-width direction of a MR multi-layered structure; and (2) Narrowing a space between lower and upper magnetic shield layers in the regions outside both side ends in the track-width direction of the MR multi-layered structure.

The easiest way for narrowing the width of the free layer is to use a milling mask with a narrower width in a patterning process for defining the track width of the MR multi-layered structure. However, because there is a physical limitation in narrowing the width of the mask made of a resist material, according to the conventional fabrication method in general, the width of the MR multi-layered structure itself was narrowed as much as possible by performing excess milling. Such excess milling might induce over-etching of not only the MR multi-layered structure itself but also the lower magnetic shield layer in the regions outside both side ends of the MR multi-layered structure. This over-etching of the lower magnetic shield layer causes its side shield effect to reduce and acts counter to the abovementioned point (2). Also, because the point (2) contributes in no small part to increase resolution in the bit direction, the over-etching may deteriorate the bit resolution.

SUMMARY OF THE INVENTION

It is therefore an object of the present invention to provide a thin-film magnetic head and a manufacturing method of a thin-film magnetic head, whereby a width of a free layer can be narrowed without lowering a shield effect of a lower magnetic shield layer.

According to the present invention, a thin-film magnetic head includes a lower magnetic shield layer, an MR multi-layered structure formed on the lower magnetic shield layer so that current flows in a direction perpendicular to surfaces of laminated layers, and an upper magnetic shield layer formed on the MR multi-layered structure. The lower magnetic shield layer consists of a first soft magnetic layer and a second soft magnetic layer laminated on and magnetically connected with the first soft magnetic layer. A part of an upper surface of the first soft magnetic layer outside both side ends in a track-width direction of the MR multi-layered structure is located lower in height than an upper surface within a region where the MR multi-layered structure is formed, of the lower magnetic shield layer. The second soft magnetic layer is formed outside both side ends in a track-width direction of the MR multi-layered structure. Namely, this second soft magnetic layer is formed in a dug part produced by performing over-etching or excess etching in the lower magnetic shield layer and arranged outside both side ends in a track-width direction of the MR multi-layered structure. Since the over-etching is performed, it is possible to narrow the width of the free layer. Also, because the second soft magnetic layer is laminated thereon, it is possible to prevent lowering in shield effect of the lower magnetic shield layer at the end surfaces in a track-width direction of the free layer.

It is preferred that at least a part of an upper surface of the second soft magnetic layer is located upper in height than the upper surface within the region where the MR multi-layered structure is formed, of the lower magnetic shield layer. Therefore, the shield effect of the lower magnetic shield layer can be more improved to further increase resolution of the thin-film magnetic head in the track-width direction.

It is also preferred that the second soft magnetic layer is in contact with parts of side end surfaces in a track-width direction of the MR multi-layered structure. In this case, more preferably, the MR multi-layered structure has a magnetization-fixed layer, a tunnel barrier layer or spacer layer laminated on the magnetization-fixed layer, and a magnetization-free layer laminated on the tunnel barrier layer or spacer layer. Also, the second soft magnetic layer terminates at side end surfaces in the track-width direction of the magnetization-fixed layer of the MR multi-layered structure or at side end surfaces in the track-width direction of a layer of the MR multi-layered structure, nearer to the lower magnetic shield layer than the magnetization-fixed layer. Therefore, the shield effect of the lower magnetic shield layer can be more improved to further increase resolution of the thin-film magnetic head in the track-width direction.

It is further preferred that the first soft magnetic layer is made of the same soft magnetic material as the second soft magnetic layer, or that the first soft magnetic layer is made of a soft magnetic material different from that of the second soft magnetic layer.

It is still further preferred that the MR multi-layered structure is a TMR multi-layered structure or a current perpendicular to plane type GMR multi-layered structure.

According to the present invention, also, a manufacturing method of a thin-film magnetic head includes a step of depositing MR multi-layered films on a lower magnetic shield layer made of a soft magnetic material, a step of etching the deposited MR multi-layered films for defining a track width to form a MR multi-layered structure, the etching being performed until a part of the lower magnetic shield layer is over-etched, a step of filling the over-etched part of the lower magnetic shield layer by a soft magnetic material, and a step of forming an upper magnetic shield layer on the MR multi-layered structure. Since a soft magnetic material fills the over-etched part of the lower magnetic shield layer, it is possible to prevent lowering in shield effect of the lower magnetic shield layer at the end surfaces in a track-width direction of the free layer. Furthermore, because the over-etching is performed, it is possible to narrow the width of the free layer.

It is preferred that the etching step includes a dry-etching step performed using a beam component with an inclined angle less than 90 degrees and equal to or more than 45 degrees with respect to a substrate surface. More preferably, this dry etching is ion beam etching (IBE).

It is also preferred that the etching step includes a first etching step performed using a beam component with an inclined angle substantially equal to 90 degrees with respect to a substrate surface, and a second etching step performed by dry etching using a beam component with an inclined angle equal to or less than 45 degrees with respect to the substrate surface. In this case, preferably, the first and second etching steps includes performing IBE, or the first etching step includes performing reactive ion etching (RIE) and the second etching step includes performing IBE.

It is further preferred that the method further includes a dry etching step performed, after the filling step, using a beam component with an inclined angle equal to or less than 45 degrees with respect to a substrate surface to remove a soft magnetic material deposited on side surfaces of the MR multi-layered structure.

It is still further preferred that the filling step includes performing ion plating.

It is preferred that the filling step includes filling the over-etched part so that at least a part of an upper surface of a soft magnetic material layer formed by the filling is located upper in height than an upper surface within a region where the MR multi-layered structure is formed, of the lower magnetic shield layer.

It is also preferred that the filling step includes filling the over-etched part so that a soft magnetic material layer formed by the filling is in contact with parts of side end surfaces in a track-width direction of the MR multi-layered structure.

It is further preferred that the step of depositing MR multi-layered films includes depositing MR multi-layered films including films for magnetization-fixed layer, a film for tunnel barrier layer or spacer layer laminated on the films for magnetization-fixed layer, and films for magnetization-free layer laminated on the film for tunnel barrier layer or spacer layer, and that the filling step includes filling the over-etched part so that a soft magnetic material layer formed by the filling terminates at side end surfaces in the track-width direction of the magnetization-fixed layer of the MR multi-layered structure or at side end surfaces in the track-width direction of a layer of the MR multi-layered structure, nearer to the lower magnetic shield layer than the magnetization-fixed layer.

It is still further preferred that the soft magnetic material of the lower magnetic shield layer is the same as the soft magnetic material filled, or that the soft magnetic material of the lower magnetic shield layer is different from the soft magnetic material filled.

It is further preferred that the MR multi-layered structure is a TMR multi-layered structure or a current perpendicular to plane type GMR multi-layered structure.

It is further preferred that the method further includes a step of forming many thin-film magnetic heads on a wafer, a step of cutting the wafer into a plurality of bars so that each bar has a plurality of thin-film magnetic heads aligned with each other, a step of lapping each bar, and a step of separating the lapped bar into a plurality of individual thin-film magnetic heads.

Further objects and advantages of the present invention will be apparent from the following description of preferred embodiments of the invention as illustrated in the accompanying drawings.

DESCRIPTION OF THE PREFERRED EMBODIMENTS

Figure 1:
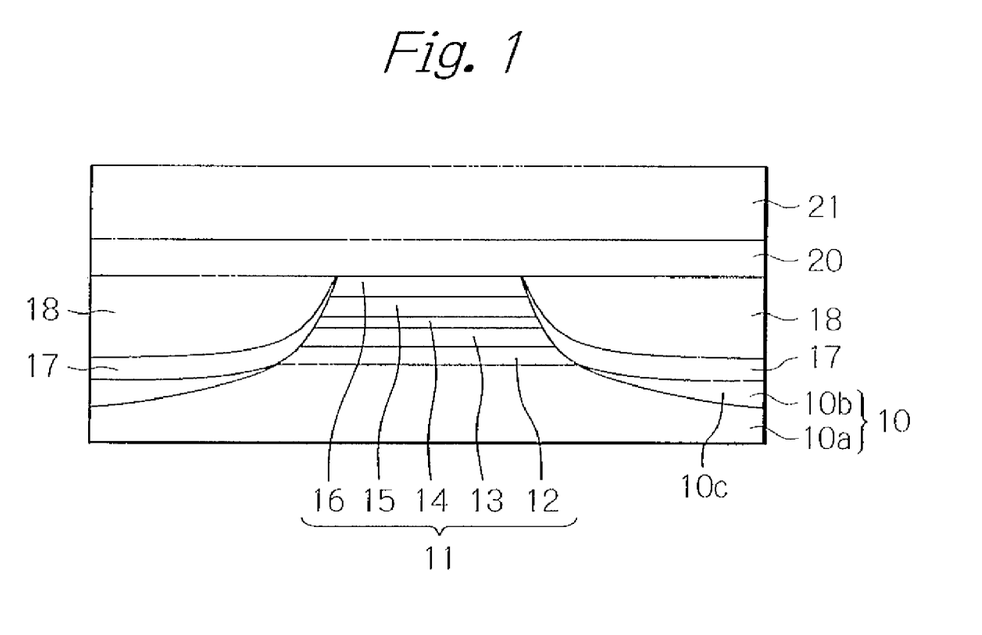
FIG. 1 shows a sectional view schematically illustrating a TMR read head element part of a thin-film magnetic head as a preferred embodiment according to the present invention.

FIG. 1 schematically illustrates a TMR read head element part of a thin-film magnetic head seen from an air-bearing surface (ABS) as a preferred embodiment according to the present invention. In the figure, to ensure greater ease in understanding the present invention, indicated are only main layers.

As shown in the figure, the TMR read head element part of the thin-film magnetic head in this embodiment has a lower magnetic shield layer 10 that doubles as a lower electrode and is made of a soft magnetic material, and a TMR multi-layered structure 11 laminated thereon. The TMR multi-layered structure 11 has a lower metal layer 12 made of a nonmagnetic metal material, a magnetization-fixed layer 13 consisting of a pin layer made of an anti-ferromagnetic material and a pinned layer with multi-layers made of a ferromagnetic material and a nonmagnetic material, a tunnel barrier layer 14 made of an insulation material, a magnetization-free layer (free layer) 15 made of a ferromagnetic material, and a cap layer 16 made of a nonmagnetic metal material, laminated in this order. On right and left sides in the track-width direction of this TMR multi-layered structure 11, an insulation layer 17 made of an insulation material and a magnetic bias layer 18 made of a hard magnetic material are laminated in this order.

Whereas, on front and back sides in the height direction of the TMR multi-layered structure 11, an insulation layer 19 (FIGS. 2h and 2i) made of an insulation material is formed.

An upper electrode layer 20 made of a nonmagnetic material and an upper magnetic shield layer 21 that doubles as a lower electrode for feeding a sense current through the TMR multi-layered structure and is made of a soft magnetic material are laminated in this order on the TMR multi-layered structure 12, the magnetic bias layer 18 and the insulation layer 19.

The lower magnetic shield layer 10 has a two-layered structure with a first soft magnetic layer 10a and a second soft magnetic layer 10b laminated in this order from the bottom. A part of an upper surface of the first soft magnetic layer 10a is located lower in height than a bottom surface of the TMR multi-layered structure 11 outside both side ends of the TMR multi-layered structure 11. The second soft magnetic layer 10b is laminated on the first soft magnetic layer 10a and magnetically continued to this first soft magnetic layer 10a. In other words, the first soft magnetic layer 10a has a dug part or recessed part 10c made by over-etching or excess-etching performed to narrow a track width of the free layer 15 of the TMR multi-layered structure 11, that is, the first soft magnetic layer 10a has the part of its upper surface located lower in height than the bottom surface of the TMR multi-layered structure 11 outside both side ends in the track-width direction, and the dug part 10c is filled by the second soft magnetic layer 10b by laminating the second soft magnetic layer 10a on the first soft magnetic layer 10a. Here, the bottom surface of the TMR multi-layered structure 11 corresponds to an upper surface of the lower magnetic shield layer 10 within a region where the TMR multi-layered structure 11 is formed. In this embodiment, the bottom surface of the TMR multi-layered structure 11 is the bottom surface of the lower metal layer 12, that is, a boundary surface between the lower magnetic shield layer 10 and the lower metal layer 12.

Since the over-etching or excess-etching is performed, it is possible to narrow the width of the free layer. Also, because the dug part 10c is filled, it is possible to prevent debasement in shield effect of the lower magnetic shield layer 10.

The first soft magnetic layer 10a and the second soft magnetic layer 10b may be made of the same soft magnetic material or of different soft magnetic materials with each other.

FIGS. 2a to 2k illustrate a part of wafer process for fabricating the TMR read head element part of the thin-film magnetic head according to the present invention. Hereinafter, wafer fabrication process of the thin-film magnetic head will be described with reference to these figures.

Figure 2A:
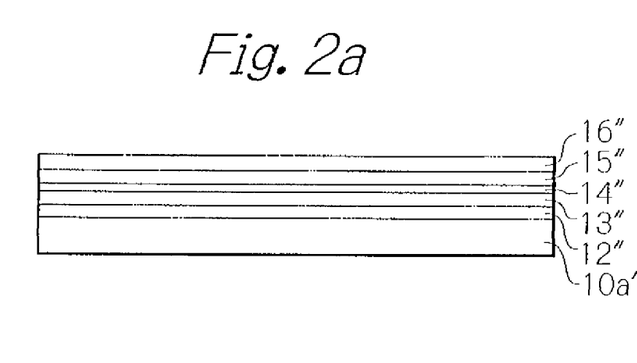
FIGS. 2a to 2k show sectional views and plane views illustrating a part of wafer process for fabricating the TMR read head element part of the thin-film magnetic head according to the present invention.
Figure 2B:
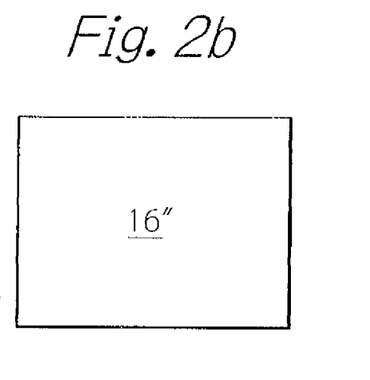

First, as shown in FIGS. 2a and 2b, a film 10a' for a first soft magnetic layer of the lower magnetic shield layer 10 which also functions as a lower electrode layer is deposited on an insulation layer (not shown) formed on a substrate (also not shown) made of a conductive material such as AlTiC ($Al_2O_3$—TiC). This film for a first soft magnetic layer 10a' is formed by for example frame plating a magnetic metal material such as nickel iron (NiFe), cobalt iron (CoFe), iron nickel cobalt (FeNiCo), iron aluminum silicide (FeAlSi), iron nitride (FeN), iron zirconium nitride (FeZrN), iron tantalum nitride (FeTaN), cobalt zirconium niobium (CoZrNb) or cobalt zirconium tantalum (CoZrTa) to have a thickness of about 100 to 3000 nm. In a desired embodiment, a NiFe film with a thickness of about 2000 nm is deposited as for the film for a first soft magnetic layer 10a'.

Then, TMR multi-layered films 11" are deposited thereon. The TMR multi-layered films 11" have films for a lower metal layer 12", films for a magnetization-fixed layer (pin layer and pinned layer) 13", a film for a tunnel barrier layer 14", films for a magnetization-free layer (free layer) 15" and a film for a cap layer 16" sequentially laminated each other.

The films for a lower metal layer 12" consist of a film deposited by sputtering for example tantalum (Ta), chrome (Cr), hafnium (Hf), niobium (Nb), zirconium (Zr), titanium (Ti), molybdenum (Mo), tungsten (W) or the like to have a thickness of about 0.5 to 5 nm, and a film deposited by sputtering for example ruthenium (Ru), nickel chrome (NiCr), NiFe, nickel iron chrome (NiFeCr), cobalt (Co), CoFe or the like to have a thickness of about 1 to 6 nm. In a desired embodiment, as the films for a lower metal layer 12", a Ta film with a thickness of about 1 nm is deposited and an Ru film with a thickness of about 2 nm is deposited on the Ta film.

Films for a magnetization-fixed layer 13" in this embodiment are formed by sequentially depositing an anti-ferromagnetic film, a ferromagnetic film, a nonmagnetic film and a ferromagnetic film from the bottom in this order. In other words, this the magnetization-fixed layer 13" consists of a film for a pinning layer and films for a pinned layer. The film for a pinning layer is the anti-ferromagnetic film, and the films for a pinned layer are synthetic multi-layered films of the ferromagnetic film, the nonmagnetic film and the ferromagnetic film laminated from the bottom in this order. The film for a pinning layer consists of an anti-ferromagnetic layer of iridium manganese (IrMn), platinum manganese (PtMn), nickel manganese (NiMn), ruthenium rhodium manganese (RuRbMn) or the like deposited by sputtering to have a thickness of about 5 to 30 nm. The films for a pinned layer consist of a first ferromagnetic film (film for an outer pinned layer) made of CoFe or the like for example having a thickness of about 1 to 5 nm, a nonmagnetic film made of an alloy including one or at least two of Ru, rhodium (Rh), iridium (Ir), Cr, rhenium (Re), Cu or the like for example having a thickness of about 0.8 nm, and a second ferromagnetic film (film for an inner pinned layer) made of CoFe, CoFeSi, CoMnGe, CoMnSi, CoMnAl or the like for example having a thickness of about 1 to 3 nm, deposited sequentially by a sputtering method for example. In a desired embodiment, as the films for the magnetization-fixed layer 13", an IrMn film with a thickness of about 7 nm, a CoFe film with a thickness of about 2 nm, an Ru film with a thickness of about 0.8 nm and a CoFe film with a thickness of about 3 nm are stacked in this order from the bottom.

A film for the tunnel barrier layer 14" is made of an oxide including aluminum (Al), Ti, Ta, Zr, Hf, magnesium (Mg), silicon (Si) or zinc (Zn) having a thickness of about 0.5 to 1 nm. In a desired embodiment, as the film for the tunnel barrier layer 14', an $Al_2O_3$ film with a thickness of about 0.6 nm is deposited.

Films for the magnetization-free layer 15" consist of a high polarization film made of CoFe, CoFeSi, cobalt manganese germanium (CoMnGe), cobalt manganese silicon (CoMnSi), cobalt manganese aluminum (CoMnAl) or the like, with a thickness of about 1 nm, and a soft magnetic film made of NiFe or the like, with a thickness of about 1 to 9 nm sequentially deposited by a sputtering method, for example. In a desired embodiment, as the film for the magnetization-free layer 15", a CoFe film with a thickness of about 1 nm is deposited and a NiFe film with a thickness of about 3 nm is deposited on the CoFe film.

A film for the cap layer 16" is made of a nonmagnetic conductive material such as Ta, Ru, Hf, Nb, Zr, Ti, Cr, W or the like with a thickness of about 1 to 10 nm deposited to have a single layer structure or a two or more layers structure by a sputtering method for example. In a desired embodiment, as the film for the cap layer 16", a Ta film with a thickness of about 5 nm is deposited.

Then, a two-layered photo-resist pattern 22 is formed thereon and the MR multi-layered films 11" are patterned by ion milling such as IBE using the photo-resist pattern as a mask for defining a track width, so as to obtain patterned MR multi-layered films 11' consisting of a first soft magnetic layer 10a of the lower magnetic shield layer 10, a film for a lower metal layer 12', films for a magnetization-fixed layer 13', a film for a tunnel barrier layer 14', films for a magnetization-free layer 15' and a film for a cap layer 16'.

Figure 2C:
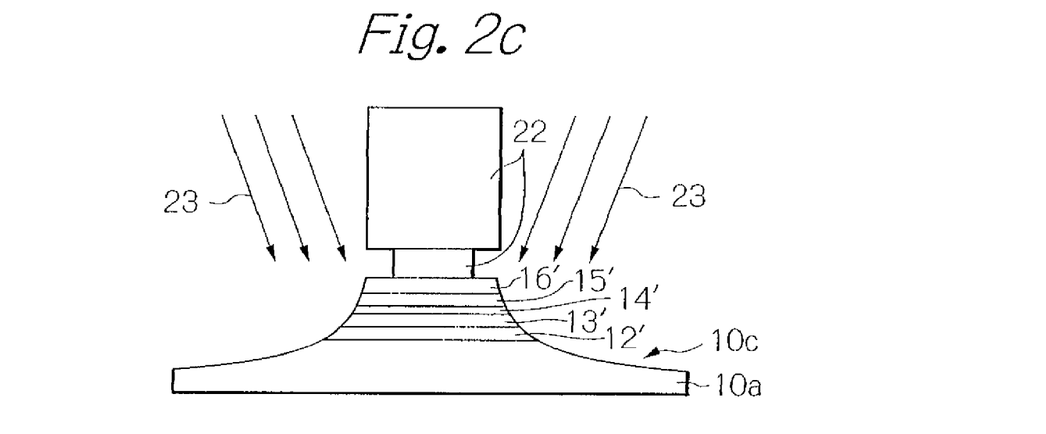

In this case, as shown in FIG. 2c, the ion milling is performed using oblique beam component 23 with an inclined angle of less than 90 degrees but equal to or more than 45 degrees with respect to the surface of the substrate, and excess ion milling is performed. Therefore, a dug part 10c that is a part with an upper surface lower than the bottom surface of the TMR multi-layered films 11' is formed on the first soft magnetic layer 10a of the lower magnetic shield layer 10 outside both side ends in the track-width direction. By performing such over-etching or excess-etching, it is possible to narrow a track width of a film for a free layer 15'. Here, the bottom surface of the TMR multi-layered films 11' corresponds to an upper surface of the lower magnetic shield layer 10 within a region where the TMR multi-layered films 11' are formed. In this embodiment, the bottom surface of the TMR multi-layered films 11' is the bottom surface of the film for a lower metal layer 12', that is, a boundary surface between the lower magnetic shield layer 10 and the film for a lower metal layer 12'.

Figure 2D:
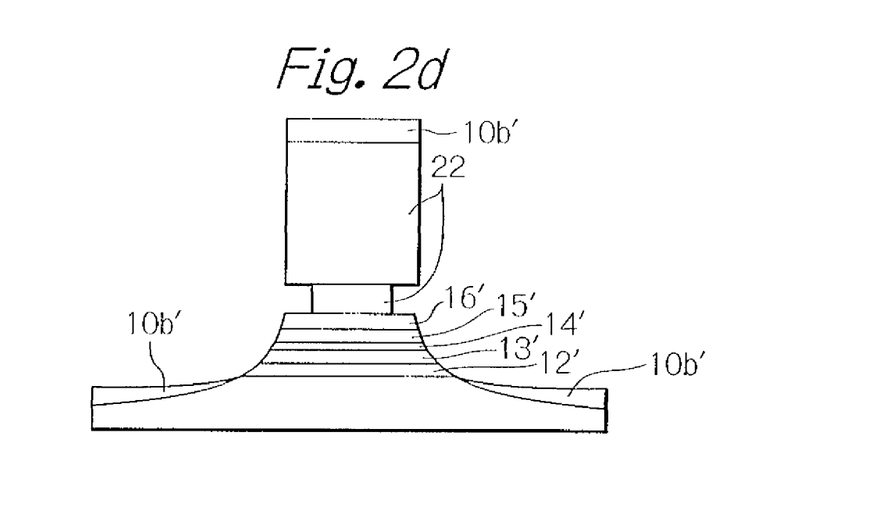

Then, as shown in FIG. 2d, the dug part 10c is filled by depositing a film for a second soft magnetic layer 10b' thereon. This film for a second soft magnetic layer 10b' is formed by depositing, using for example a sputtering method with an incident angle of 90 degrees with respect to the substrate surface, an IBD (Ion Beam Deposition) method or an ion plating method, a magnetic metal material such as NiFe, CoFe, FeNiCo, FeAlSi, FeN, FeZrN, FeTaN, CoZrNb or CoZrTa to have a thickness of about 3 to 30 nm. In a desired embodiment, a NiFe film with a thickness of about 10 nm is deposited as for the film for a second soft magnetic layer 10b'. Because the dug part 10c is filled by depositing a film for a second soft magnetic layer 10b', it is possible to prevent lowering in a shield effect of the lower magnetic shield layer 10.

Then, if necessary, the film for a second soft magnetic layer 10b' attached on side surfaces of the film for a tunnel barrier layer or spacer layer of the TMR multi-layered films 11' is removed by a low angle milling using oblique beam component with an inclined angle of less than 45 degrees with respect to the surface of the substrate.

Figure 2E:
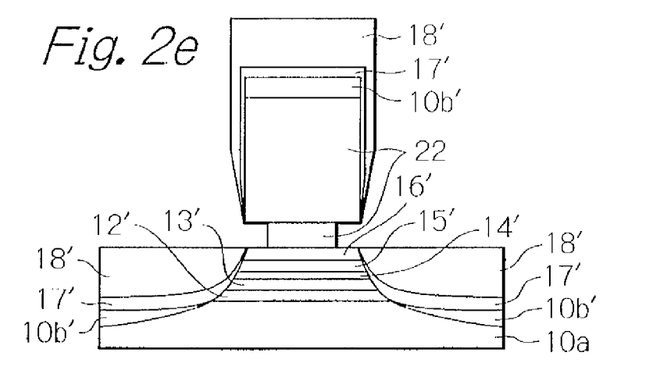

Thereafter, as shown in FIG. 2e, a film for an insulation layer 17' and films for a hard magnetic layer or magnetic bias layer 18' are deposited.

The film for an insulation layer 17' is formed from an insulation material such as $Al_2O_3$ or $SiO_2$ deposited by a sputtering method, an IBD method or the like to have a thickness of about 3 to 10 nm. The films for a magnetic bias layer 18' are formed from an under film made of Cr with a thickness of about 5 nm and a ferromagnetic film made of a material mainly composed of Co such as CoPt alloy for example with a thickness of about 5 to 40 nm deposited by a sputtering method or an IBD method for example, and from a bias protection film made of Ta for example with a thickness of about 5 nm deposited thereon by a sputtering method or an IBD method for example. In a desired embodiment, an $Al_2O_3$ film with a thickness of about 5 nm is deposited as the film for an insulation layer 17', a Cr film with a thickness of about 5 nm is deposited thereon as the under film for the bias magnetic layer 18', a CoPt film with a thickness of about 25 nm is deposited thereon as the ferromagnetic film for the bias magnetic layer 18', and a Ta film with a thickness of about 5 nm is deposited thereon as the bias protection film.

Figure 2F:
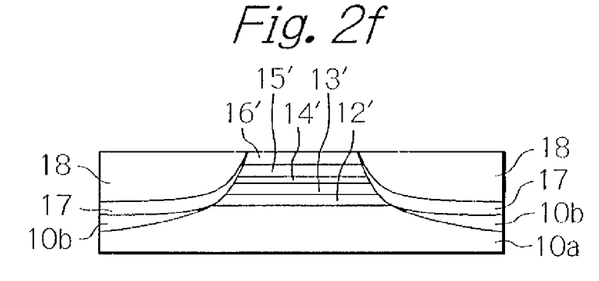
Figure 2G:
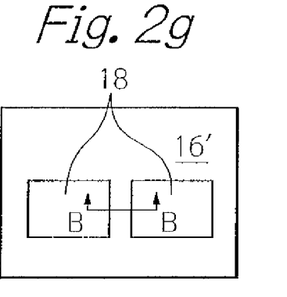

Thereafter, the photo-resist pattern 22 is removed, namely the lift-off process is performed, so as to obtain a second soft magnetic layer 10b, an insulation layer 17 and a magnetic bias layer 18 as shown in FIGS. 2f and 2g.

Then, a photo-resist pattern (not shown) is formed on the film for a cap layer 16' and the films for the magnetic bias layer 18', and the MR multi-layered films 11' are patterned by ion milling using the photo-resist pattern as a mask for defining a length perpendicular to the track width (length along the MR height), so as to obtain an MR multi-layered structure 11 consisting of a lower metal layer 12, a magnetization-fixed layer 13, a tunnel barrier layer 14, a magnetization-free layer 15 and a cap layer 16, and a film for an insulation layer is deposited thereon. This film for an insulation layer is formed from an insulation material such as $Al_2O_3$ or $SiO_2$ deposited by a sputtering method, an IBD method or the like to have a thickness of about 60 nm.

Figure 2H:
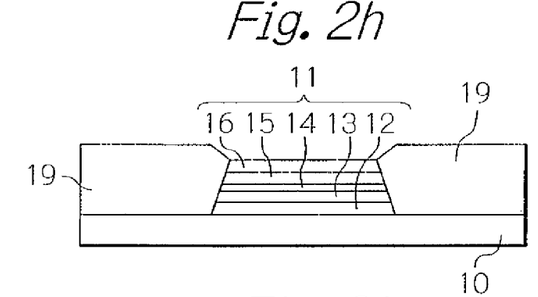
Figure 2I:
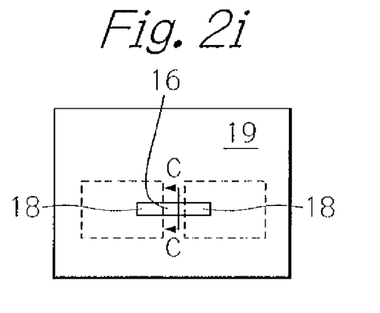

Then, the photo-resist pattern is removed, namely the lift-off process is performed, so as to obtain an insulation layer 19 as shown in FIGS. 2h and 2i. It should be noted that FIG. 2h shows a C-C line section of FIG. 2i seen from a different direction as that of FIG. 2f that shows a B-B line section of FIG. 2g.

Figure 2J:
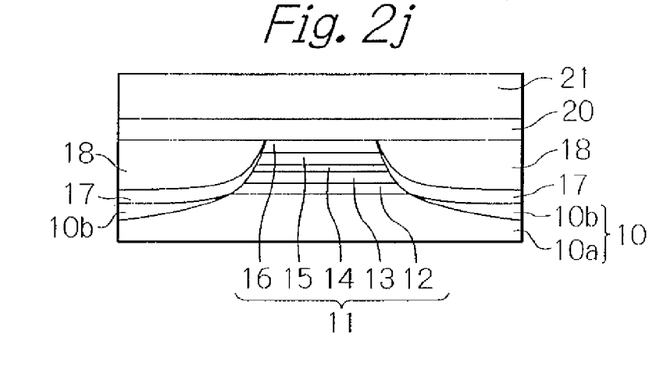
Figure 2K:
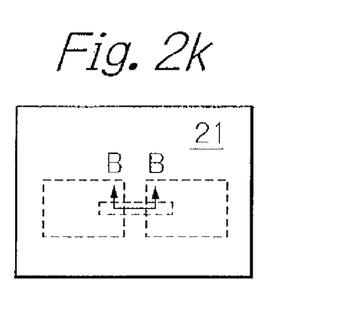

Thereafter, an upper metal layer 20 and an upper magnetic shield layer 21 are deposited thereon as shown in FIGS. 2j and 2k. It should be noted that FIG. 2j is a B-B line section of FIG. 2k.

The upper metal layer 20 is formed by depositing a non-magnetic conductive material such as Ta, Ru, Hf, Nb, Zr, Ti, Cr or W, using a sputtering method for example, to have a thickness of about 3 to 20 nm. In a desired embodiment, a Ta film with a thickness of about 10 nm is deposited as for the upper metal layer 20.

The upper magnetic shield layer 21 is formed by depositing a magnetic metal material such as NiFe, CoFe, FeNiCo, FeAlSi, FeN, FeZrN, FeTaN, CoZrNb or CoZrTa, using a frame plating method for example, to have a thickness of about 100 to 3000 nm. In a desired embodiment, a NiFe film with a thickness of about 2000 nm is deposited as for the upper magnetic shield layer 21.

Typically, write head elements are fabricated on thus formed read head elements to complete a thin-film magnetic head wafer.

Figure 3A:
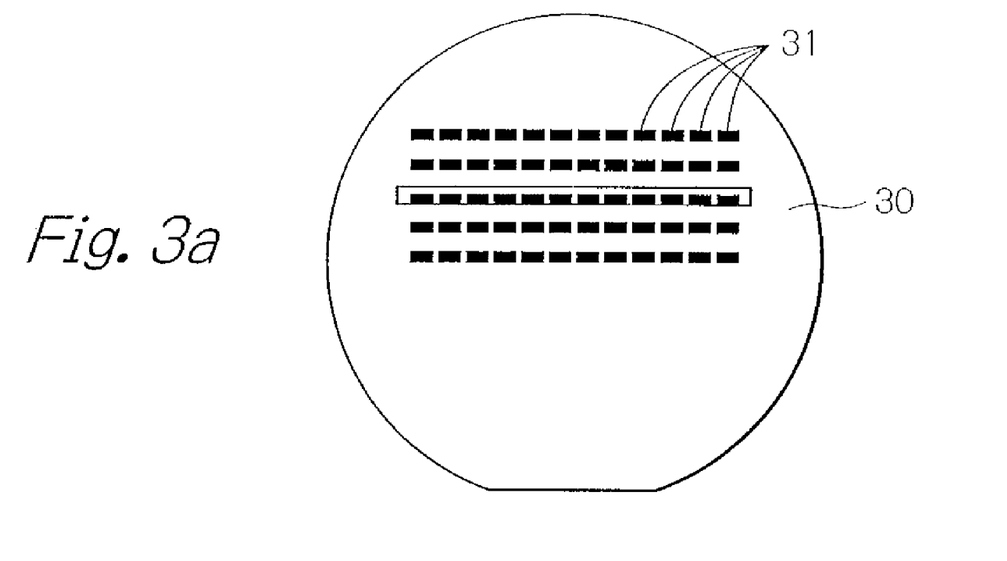
FIGS. 3a to 3c show a plane view, a perspective view and a side view illustrating processes of obtaining bars from the thin-film magnetic head wafer and adjusting the MR-height of the thin-film magnetic head.
Figure 3B:
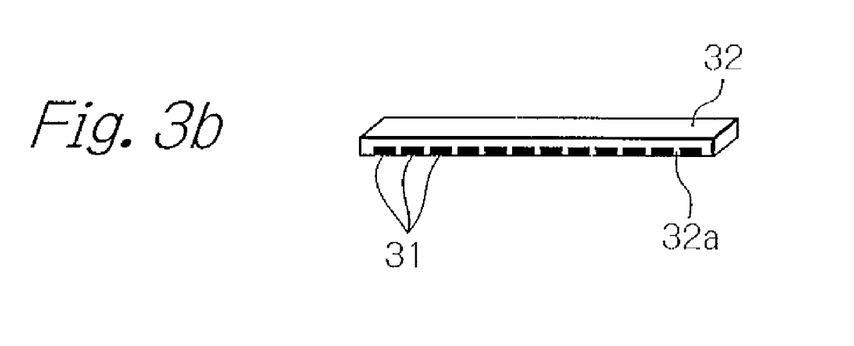
Figure 3C:
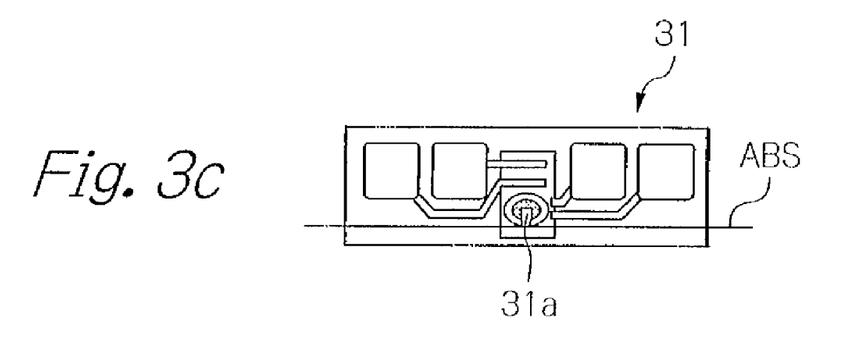

After the above-mentioned wafer process, a plurality of bars are obtained from the fabricated thin-film magnetic head wafer and MR height of each bar is adjusted. FIGS. 3a to 3c illustrate a part of this process for obtaining bars and for adjusting the MR height of each bar.

As shown in FIG. 3a, in the wafer process, many of thin-film magnetic heads are formed to arrange in matrix on an integration surface of the thin-film magnetic head wafer 30. The wafer 30 is then cut into a plurality of bars 32 so that each bar has a plurality of thin-film magnetic heads 31 aligned with each other as shown in FIG. 3b. Then, an ABS side surface 32a of each bar 32 is lapped to adjust the MR height. This MR-height adjustment is executed until a magnetic head element section 31a of each thin-film magnetic head 31 exposes at the ABS as shown in FIG. 3c.

According to the aforementioned processes of this embodiment, because over-etching or excess-etching is performed, it is possible to narrow a track width of the magnetization-free layer or free layer 15. Also, because the dug part 10c due to the over-etching is filled by the second soft magnetic layer 10b, it is possible to prevent lowering in shield effect of the lower magnetic shield layer 10, particularly near side end surfaces of the free layer 15 in the track-width direction.

Figure 4:
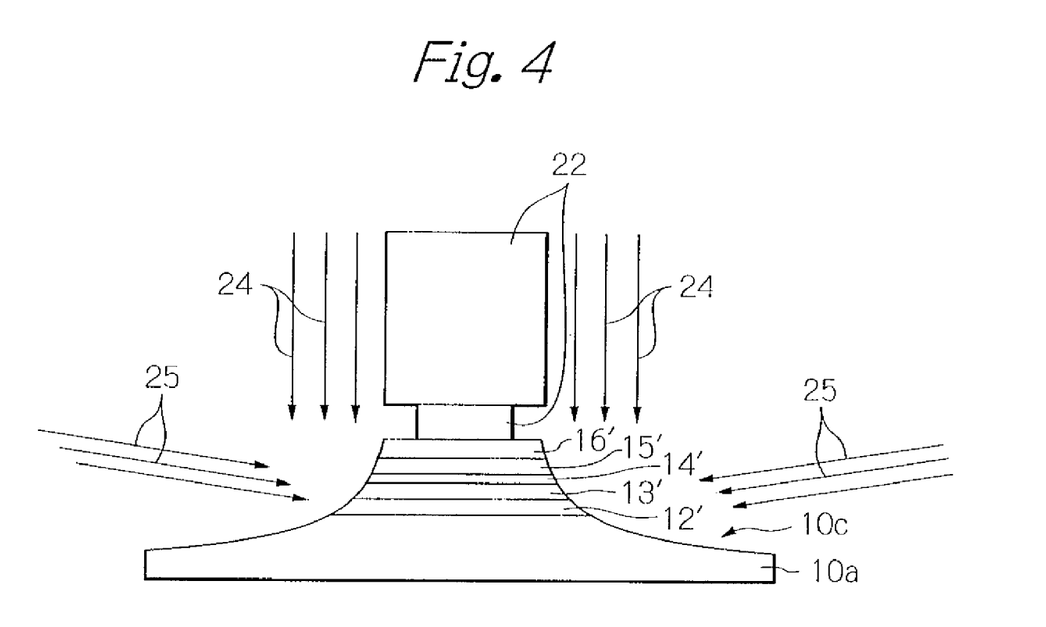
FIG. 4 shows a sectional view illustrating a modification of a milling process shown in FIG. 2c.

FIG. 4 illustrates a modification of a milling process for defining the track width, shown in FIG. 2c.

In this modification, a two-staged ion milling is performed. As a first stage, an ion milling or dry etching such as IBE for example is performed using a beam component 24 with an inclined angle of about 90 degrees with respect to the surface of the substrate, and then, as a second stage, an ion milling or dry etching such as IBE for example is performed using oblique beam component 25 with an inclined angle of equal to or less than 45 degrees with respect to the surface of the substrate in order to narrow the free layer width and to execute over-milling. As for the first stage, RIE may be performed instead of the ion milling.

Table 1 represents a concrete example of layer structure of the TMR read head element part of the thin-film magnetic head in this first embodiment. In this Table, a layer represented by a plurality of materials has a multi-layered structure and a layer indicated left hand is a lower side layer. Also, values inside parentheses show layer thickness.

TABLE 1

| | |
|---|---|
| Insulation Layer 19 | $Al_2O_3$(60 nm) |
| Magnetic Bias Layer 18 | Cr(5 nm)/CoPt(25 nm)/Ta(5 nm) |
| Insulation Layer 17 | $Al_2O_3$(5 nm) |
| Upper Magnetic Shield Layer 21 | NiFe(2000 nm) |
| Upper Metal Layer 20 | Ta(10 nm) |
| Cap Layer 16 | Ta(5 nm) |
| Magnetization-Free Layer 15 | CoFe(1 nm)/NiFe(3 nm) |
| Tunnel Barrier Layer 14 | $Al_2O_3$(0.6 nm) |
| Magnetization-Fixed Layer 13 | IrMn(7 nm)/CoFe(2 nm)/Ru(0.8 nm)/CoFe(3 nm) |
| Lower Metal Layer 11 | Ta(1 nm)/Ru(2 nm) |
| Second Soft Magnetic layer 10b | NiFe(10 nm) |
| First Soft Magnetic layer 10a | NiFe(2000 nm) |

Figure 5:
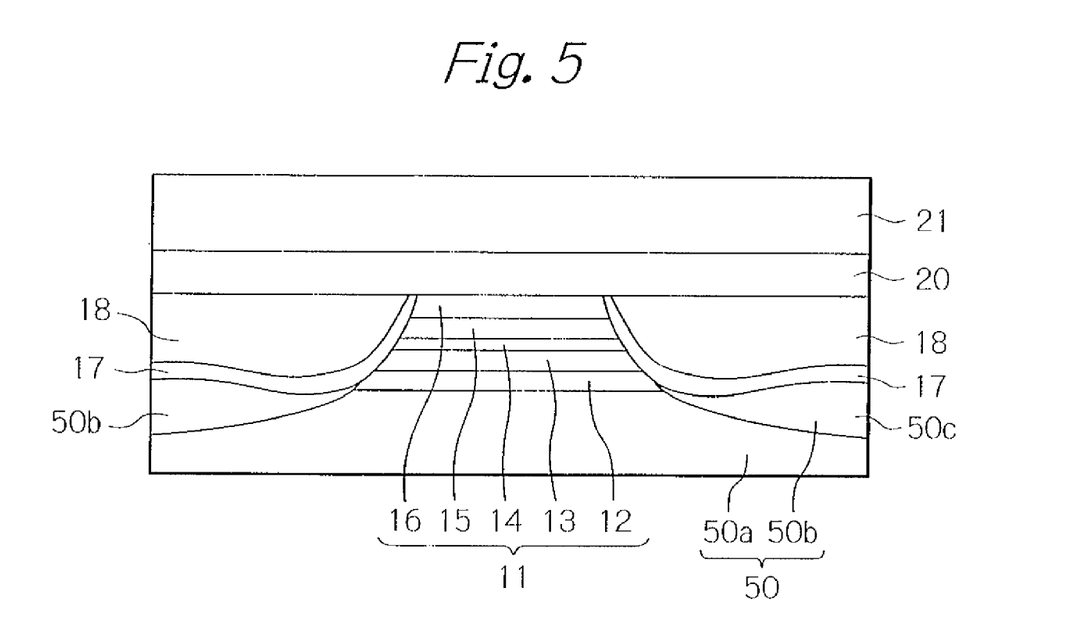
FIG. 5 shows a sectional view schematically illustrating a TMR read head element part of a thin-film magnetic head as another embodiment according to the present invention.

FIG. 5 schematically illustrates a TMR read head element part of a thin-film magnetic head after an MR-height adjustment process as another embodiment according to the present invention. In the figure, to ensure greater ease in understanding the present invention, indicated are only main layers.

In this embodiment, a dug part 50c formed, by performing over-etching, in a first soft magnetic layer 50a of a lower magnetic shield and lower electrode layer 50 is filled by depositing a second soft magnetic layer 50b. However, as shown in the figure, since the second soft magnetic layer 50b is sufficiently thick, its upper surfaces at regions separated from the TMR multi-layered structure 11 in track-width directions lie higher than the bottom surface of the lower metal layer 12, namely than the bottom surface of the TMR multi-layered structure 11. Thus, better shield effect of the lower magnetic shield layer 50 can be obtained to more increase resolution in the track-width direction.

Another configurations of the thin-film magnetic head in this embodiment are the same as these in the embodiment of FIG. 1. Therefore, in FIG. 5, the same reference numerals are used for the similar components as these in FIG. 1. Furthermore, another operations and advantages of the thin-film magnetic head in this embodiment are the same as these in the embodiment of FIG. 1.

Variations in resolution in the track-width direction depending upon location of the upper surface of the lower magnetic shield layer were actually measured. Table 2 indicates the result of this measurement.

TABLE 2

| Sample | Location of Upper Surface of Lower Magnetic Shield Layer | Half Value Width $W_{MR50}$ | Sharpness Ratio $W_{MR50}/W_{MR10}$ |
|---|---|---|---|
| 1 | −10 nm | 69 nm | 39.1% |
| 2 | 0 nm | 67 nm | 40.1% |
| 3 | +5 nm | 68 nm | 41.5% |

Figure 6:
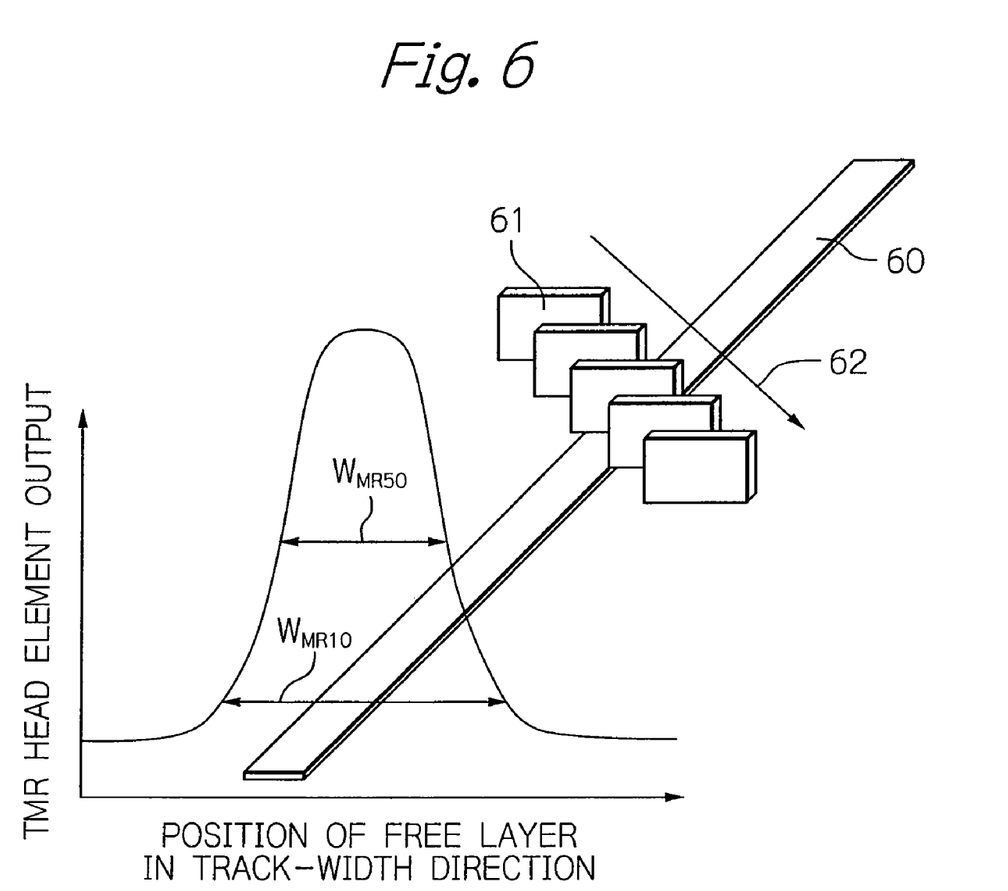
FIG. 6 shows a view illustrating a measurement method for finding out how a resolution in a track-width direction varies depending upon a position of an upper surface of a lower magnetic shield layer.

This measurement was done, as shown in FIG. 6, by measuring an output of a TMR read head element when a free layer 61 of the TMR read head element was relatively moved along an arrow 62 with respect to a track 60. Used was a spin stand with a perpendicular magnetic recording magnetic disk of 3.5 inches. An applied voltage to the TMR read head element was 140 mV. A sample 1 corresponds to a conventional art TMR read head element in which over-etching is performed to form a dug part but this dug part is not filled. Thus, in this sample 1, an upper surface of a lower magnetic shield layer lies at a height position lower than a bottom surface of a TMR multi-layered structure by 10 nm. That is, only digging of 10 nm depth is performed. A sample 2 corresponds to a TMR read head element according to the present invention, in which over-etching is performed to form a dug part and this dug part is filled. Thus, in this sample 2, an upper surface of a lower magnetic shield layer lies at the same height position as a bottom surface of a TMR multi-layered structure. That is, digging of 10 nm depth and filling of 10 nm height are performed. A sample 3 corresponds to a TMR read head element according to the present invention, in which over-etching is performed to form a dug part and this dug part is sufficiently filled. Thus, in this sample 3, an upper surface of a lower magnetic shield layer lies at a height position higher than a bottom surface of a TMR multi-layered structure by 5 nm. That is, digging of 10 nm depth and filling of 15 nm height are performed. The measurement was performed for 100 elements for each sample and each indicated value is an average of the measured values.

As will be noted from Table 2, half value widths (signal widths at half of the maximum output values) $W_{MR50}$ of the respective samples are substantially the same with each other. However, a sharpness ratio $W_{MR50}/W_{MR10}$ of sample 2 with the filled dug part is greater than that of sample 1. This means that sample 2 can provide a sharp detection output, so as to increase resolution in the track-width direction. Also, a sharpness ratio $W_{MR50}/W_{MR10}$ of sample 3 with the sufficiently filled dug part is greater than that of sample 2. This means that sample 3 can provide a more sharp detection output, so as to more increase resolution in the track-width direction. It should be noted that $W_{MR10}$ indicates a ¹/₁₀ value width (a signal width at ¹/₁₀ of the maximum output value).

Figure 7:
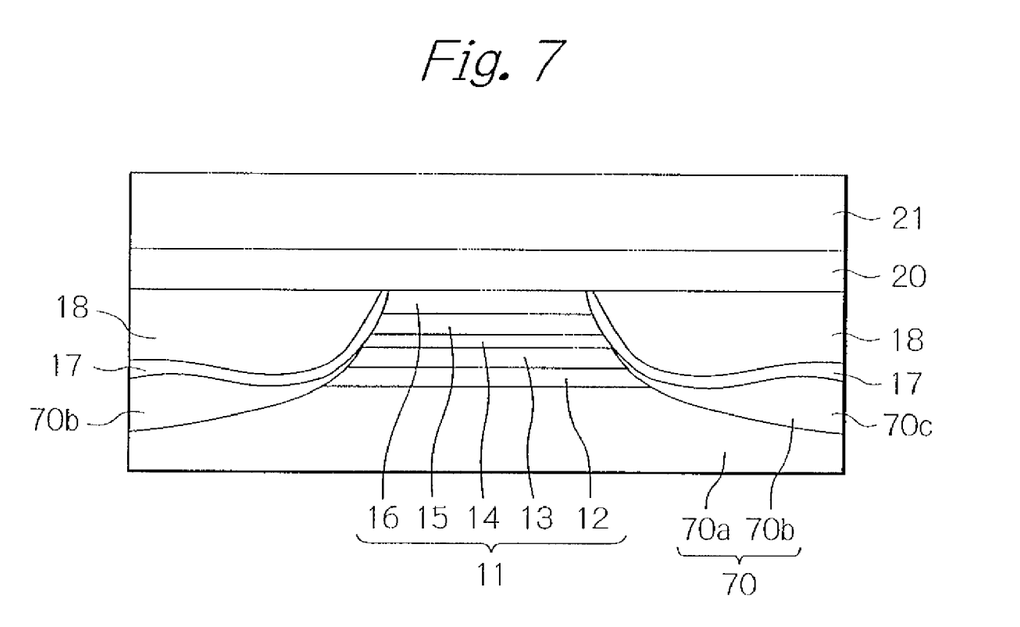
FIG. 7 shows a sectional view schematically illustrating a TMR read head element part of a thin-film magnetic head as further embodiment according to the present invention.

FIG. 7 schematically illustrates a TMR read head element part of a thin-film magnetic head after an MR-height adjustment process as further embodiment according to the present invention. In the figure, to ensure greater ease in understanding the present invention, indicated are only main layers.

In this embodiment, a dug part 70c formed, by performing over-etching, in a first soft magnetic layer 70a of a lower magnetic shield and lower electrode layer 70 is filled by depositing a second soft magnetic layer 70b. However, as shown in the figure, not only the second soft magnetic layer 70b is sufficiently thick but also the second soft magnetic layer 70b contacts parts of both side end surfaces of the TMR multi-layered structure 11 in the track-width direction. Thus, better shield effect of the lower magnetic shield layer 70, particularly near side end surfaces of the TMR multi-layered structure 11 in the track-width direction, can be obtained to more increase resolution in the track-width direction. However, in this embodiment, it is necessary that the second soft magnetic layer 70b terminates at side end surfaces in the track-width direction of the magnetization-fixed layer 13 or at side end surfaces in the track-width direction of a layer lower than this magnetization-fixed layer 13 (a layer nearer to the lower magnetic shield layer) such as the lower metal layer 12 in this embodiment. This is because if the second soft magnetic layer 70b is in contact with the side end surfaces of the tunnel barrier layer 14 of the TMR multilayered structure 11, this tunnel barrier layer 14 is shortened and thus no TMR operation is possible.

Another configurations of the thin-film magnetic head in this embodiment are the same as these in the embodiment of FIG. 1. Therefore, in FIG. 7, the same reference numerals are used for the similar components as these in FIG. 1. Furthermore, another operations and advantages of the thin-film magnetic head in this embodiment are the same as these in the embodiment of FIG. 1.

In the aforementioned embodiments, the thin-film magnetic head has a TMR read head element. However, in modifications, a CPP-GMR read head element may be used instead of the TMR read head element. In the latter case, a spacer layer will be used instead of the tunnel barrier layer.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A thin-film magnetic head, comprising:
   a lower magnetic shield layer;
   a magnetoresistive effect multi-layered structure formed on said lower magnetic shield layer so that current flows in a direction perpendicular to surfaces of laminated layers; and
   an upper magnetic shield layer formed on said magnetoresistive effect multi-layered structure,
   said lower magnetic shield layer consisting of a first soft magnetic layer and a second soft magnetic layer laminated on and magnetically connected with said first soft magnetic layer, said first soft magnetic layer having a recessed part in which a part of an upper surface of said first soft magnetic layer outside both side ends in a track-width direction of said magnetoresistive effect multi-layered structure being located lower in height than an upper surface within a region where said magnetoresistive effect multi-layered structure is formed, said second soft magnetic layer being formed inside the recessed part outside both side ends in the track-width direction of said magnetoresistive effect multi-layered structure.

2. The thin-film magnetic head as claimed in claim 1, wherein at least a part of an upper surface of said second soft magnetic layer is located higher in height than the upper surface within the region where said magnetoresistive effect multi-layered structure is formed, of said lower magnetic shield layer.

3. The thin-film magnetic head as claimed in claim 1, wherein said second soft magnetic layer is in contact with parts of side end surfaces in the track-width direction of said magnetoresistive effect multi-layered structure.

4. The thin-film magnetic head as claimed in claim 3, wherein said magnetoresistive effect multi-layered structure has a magnetization-fixed layer, a tunnel barrier layer or spacer layer laminated on said magnetization-fixed layer, and a magnetization-free layer laminated on said tunnel barrier layer or spacer layer, and wherein said second soft magnetic layer terminates at side end surfaces in the track-width direction of said magnetization-fixed layer of said magnetoresistive effect multi-layered structure or at side end surfaces in the track-width direction of a layer of said magnetoresistive effect multi-layered structure, nearer to said lower magnetic shield layer than said magnetization-fixed layer.

5. The thin-film magnetic head as claimed in claim 1, wherein said first soft magnetic layer is made of the same soft magnetic material as said second soft magnetic layer.

6. The thin-film magnetic head as claimed in claim 1, wherein said first soft magnetic layer is made of a soft magnetic material different from that of said second soft magnetic layer.

7. The thin-film magnetic head as claimed in claim 1, wherein said magnetoresistive effect multi-layered structure is a tunnel magnetoresistive effect multi-layered structure or a current perpendicular to plane type giant magnetoresistive effect multi-layered structure.

* * * * *